United States Patent [19]
Fucili et al.

[11] Patent Number: 5,625,309
[45] Date of Patent: Apr. 29, 1997

[54] BISTABLE SEQUENTIAL LOGIC NETWORK THAT IS SENSITIVE TO THE EDGES OF INPUT SIGNALS

[75] Inventors: Giona Fucili; Aldo Novelli, both of Milan, Italy

[73] Assignee: SGS-Thomson Microelectronics S.r.l., Agrate Brianza, Italy

[21] Appl. No.: 455,856

[22] Filed: May 31, 1995

[30] Foreign Application Priority Data

May 31, 1994 [EP] European Pat. Off. ............. 94830265

[51] Int. Cl.$^6$ ............................ H03K 3/289; H03K 3/037
[52] U.S. Cl. ...................... 327/217; 327/198; 327/202; 326/46
[58] Field of Search ............................... 326/21, 104, 93, 326/46; 327/215, 217, 202, 198, 34

[56] References Cited

U.S. PATENT DOCUMENTS

| | | | |
|---|---|---|---|
| 3,976,949 | 8/1976 | Hepworth et al. | 328/206 |
| 4,607,173 | 8/1986 | Knoedl, Jr. | 327/215 |
| 4,894,557 | 1/1990 | Beltramini | 327/217 |
| 4,980,577 | 12/1990 | Baxter | 327/217 |
| 5,124,568 | 6/1992 | Chen et al. | 327/217 |

OTHER PUBLICATIONS

Carr, Dr. William N. and Dr. Jack P. Mize *MOS/LSI Design and Application*, McGraw–Hill Book Company, New York, 1972, pp. 107–145.

MacFarlane, Ian P., "Pulse Generator and Flip–Flops", IEEE Transactions on Instrumentation and Measurement, vol. IM–21, No. 2, May 1972, pp. 148–153.

Carr, Dr. William N. and Mize, Dr. Jack P., "MOS/LSI Design and Application", McGraw–Hill Book Company, 1972, pp. 138–141.

Mano, Morris M. *Computer Engineering: Hardward Design*, Prentice Hall: New Jersey, 1988, pp. 122–124.

*Primary Examiner*—Edward P. Westin
*Assistant Examiner*—Jon Santamauro
*Attorney, Agent, or Firm*—David V. Carlson; Clarence T. Tegreene; Seed and Berry LLP

[57] ABSTRACT

A bistable logic network of the sequential type, responsive to the edges of input signals, comprising first and second input SR flip-flops which are connected to an output SR flip-flop through two transfer and block logic gates.

Each of said logic gates has two input terminals connected to the output terminal and to one input terminal of an input flip-flop.

The output terminals of the output flip-flop are feedback connected to the other input terminals of the two input flip-flops.

16 Claims, 1 Drawing Sheet

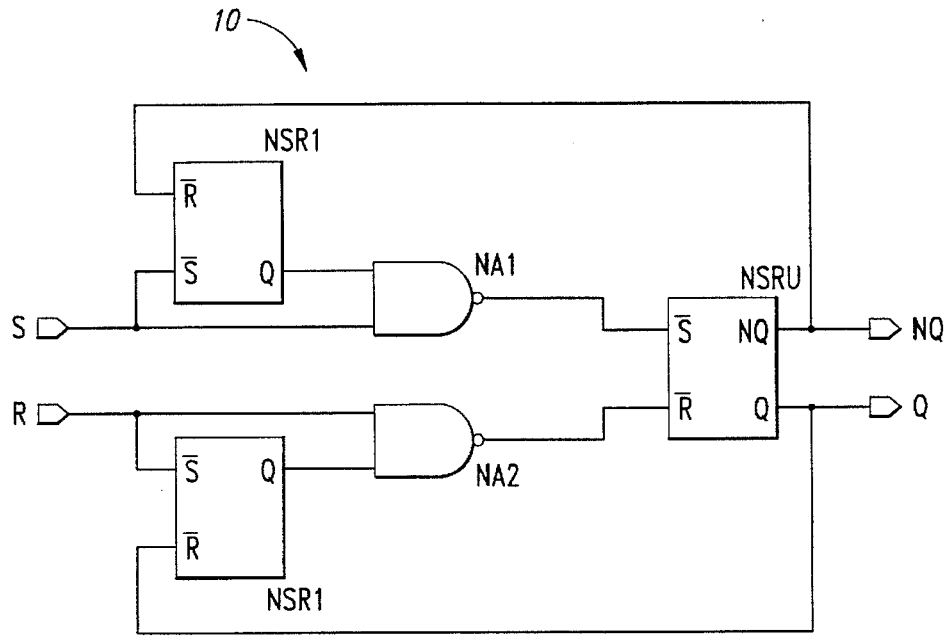
*Fig. 1 - FFSRE*
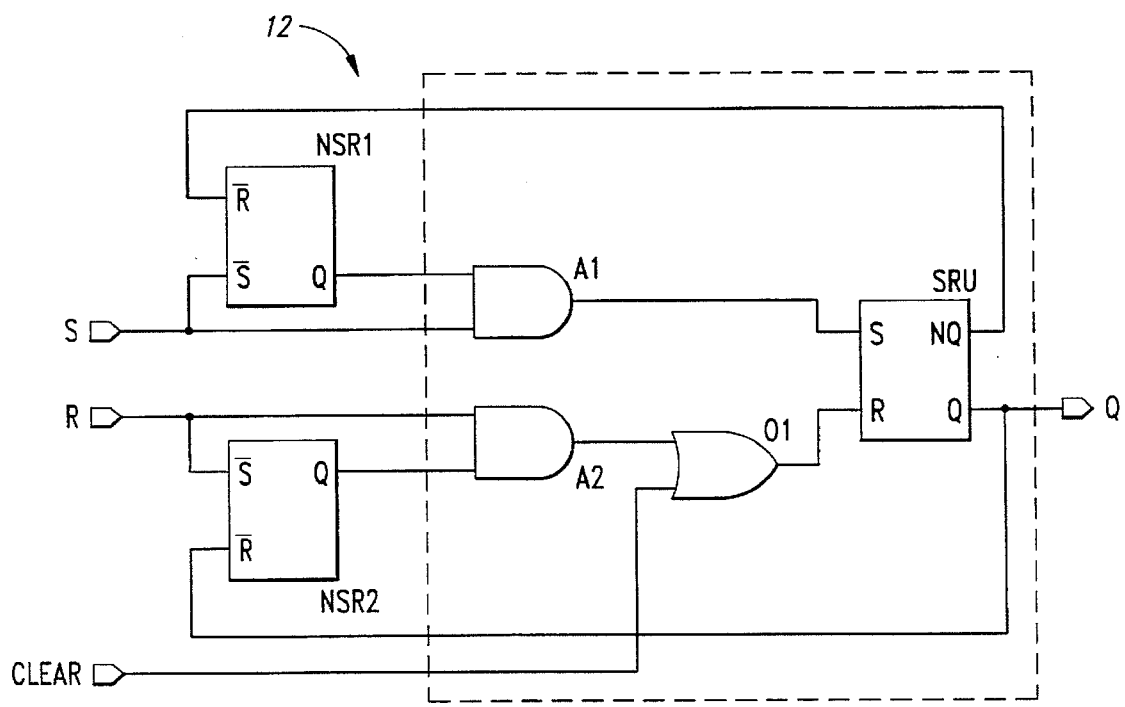
*Fig. 2*

BISTABLE SEQUENTIAL LOGIC NETWORK THAT IS SENSITIVE TO THE EDGES OF INPUT SIGNALS

TECHNICAL FIELD

This invention relates to logic networks of the sequential type, and in particular to bistable circuits (also referred to as "flip-flops" in related literature) of the Set-Reset or SR type.

BACKGROUND OF THE INVENTION

Logic networks, such as flip-flops, are in general use, especially as logic-state storage elements in integrated circuits of the digital type.

A logic state of "1" is usually associated with a signal at a high level, i.e., "logic high", and a logic state of "0" with a signal at a low level, i.e., "logic low".

A standard SR flip-flop is an asynchronous sequential network having two inputs, S and R, and an output, Q.

When to the input S is applied a Set signal, typically at a logic high (usually a pulse of short duration), the flip-flop outputs a signal whose logic level remains high until a Reset signal at a logic high level is applied to the input R.

It is important to observe that the simultaneous application of signals at a logic high to both Set and Reset terminals is not envisaged by existing SR flip-flops.

Thus, the output Q of an SR flip-flop is responsive to the level of the input signals.

But this feature may introduce problems in certain applications. In fact, the way the Set and Reset signals follow each other may be inconsistent, and their time duration may be undefined, so that there may be time intervals when to both inputs are applied signals that are logic high. Such an application often makes the flip-flop operation erratic, resulting in faulty operation of the device in which it is connected.

A prior attempted solution to this drawback has been to make the Set-Reset flip-flop responsive, rather than to the level of the input signal, to the signal leading or trailing edges—i.e., the signal edges—present in the signal waveform.

The SR flip-flop responsive to signal edges is a logic network (finite state sequential machine) having two inputs (S and R) and an output (Q). When a useful signal edge appears at the input S, a logic "1" is placed on the output Q, and when a useful signal edge appears at the input R, a logic "0" is placed on the output Q. The flip-flop state (and, hence, the state of the output Q) does not change before a useful edge appears at the opposite input from the one that altered it. The useful edges for the two inputs may differ from each other, but for each of the inputs, there can be but one useful edge: either the leading (positive-going) edge or the trailing (negative-going) edge.

Throughout the ensuing description, it should be understood that a high logic level represents a "1", and a low logic level a "0". As for the polarity of the useful edges, the positive polarity will be considered for both inputs.

In the prior art, it has been common practice to make an SR flip-flop responsive to signal edges by providing an SR flip-flop with a shunter or a monostable on its inputs.

In either case, however, the system operation is tied to the time constants of the shunter or the monostable as concerns the acquisition times of the flip-flop. Often, these time constants cannot be made very small, and thus they will slow down the dynamic range (penalizing in particular the minimum time between two useful edges) of the system accordingly.

Furthermore, the integration area occupied by such structures placed at the inputs is far from negligible compared to the size of the flip-flop, while performance becomes contingent both on variations in the integrating process and on such additional parameters as temperature or supply voltage.

An example of an SR flip-flop responsive to signal edges which uses monostables on its inputs is disclosed in U.S. Pat. No. 3,976,949 granted to Motorola Inc. on Aug. 24, 1976, which is incorporated by reference herein.

SUMMARY OF THE INVENTION

An object of this invention is to provide a Set-Reset flip-flop that is responsive to signal edges, can operate accurately under any conditions, and affords excellent dynamic performance and operational features unaffected by both variations in the integrating process and the technologies (TTL, CMOS, ECL) employed to implement the logic gates associated with it.

In accordance with one aspect of the present invention, a sequential logic circuit includes set and reset input terminals. A first flip-flop has a first input terminal coupled to the set terminal, a second input terminal, and an output terminal. A second flip-flop has a first input terminal coupled to the reset terminal, a second input terminal, and an output terminal. A first gate has a first input terminal coupled to the set terminal, a second input terminal coupled to the output of the first flip-flop, and an output terminal. A second gate has a first input terminal coupled to the reset terminal, a second input terminal coupled to the output of the second flip-flop, and an output terminal. A third flip-flop has a first input terminal coupled to the output of the first gate, a second input terminal coupled to the output of the second gate, a first output terminal coupled to the second input of the first flip-flop, and a second output terminal coupled to the second input of the second flip-flop.

In accordance with a related aspect of the invention, the output of the second gate and the second input of the third flip-flop are not intercoupled. Instead, the circuit includes a clear terminal and a third gate, which has a first input terminal coupled to the output of the second gate, a second input terminal coupled to the clear terminal, and an output terminal coupled to the second input of the third flip-flop.

BRIEF DESCRIPTION OF THE DRAWINGS

The features and advantages of an SR flip-flop according to the invention will become apparent from the following description of an embodiment thereof, given by way of example and not of limitation with reference to the accompanying drawings.

In such drawings,

FIG. 1 is a circuit diagram of an SR flip-flop responsive to signal edges according to the invention, and FIG. 2 is a circuit diagram of another embodiment of a flip-flop according to the invention.

DETAILED DESCRIPTION OF THE INVENTION

As shown in both FIG. 1 and FIG. 2, an SR flip-flop 10 and 12, respectively, responsive to signal edges according to this invention is made up of two input flip-flops, which are connected to an output flip-flop through two logic gates that are both transfer and block gates.

While the three flip-flops shown in the FIGS. 1 and 2 are of the known Set-Reset type, other types of bistable circuits may be used with appropriate logic gates. Examples of flip-flops that may be used with the present invention include those shown in "MOS/LSI Design and Application," Carr et al., McGraw-Hill 1972, pp. 138–41.

Each of the two logic gates has an input terminal connected to the output terminal of one input flip-flop and an input terminal connected to the Set terminal of that input flip-flop, which also forms an input terminal for the circuit as a whole.

A characterizing feature of a flip-flop responsive to signal edges according to the invention is that the output terminals of the output flip-flop are feedback connected to the Reset terminals of the two input flip-flops.

A theoretical diagram for the SR flip-flop 10 responsive to signal edges is depicted in FIG. 1.

The flip-flops employed are all of the SR type implemented with NAND gates as is known.

The following is a discussion of the operation of a flip-flop according to the invention.

For purposes of example, the SR flip-flop 10 responsive to signal edges is assumed to be in its Reset state (i.e., a low output Q), and both inputs to be logic "0". Under this condition, the flip-flops NSR1 and NSR2 will be in the Set state (i.e., a high output Q) and NSRU be retaining its Reset state because both inputs are at a high.

If the input R goes high, a short duration pulse may appear on the output of the gate NA2. (This will depend on the "thresholds" and the speed of NSR2, since the latter will enter a Reset state as soon as R goes high on account of a "0" being present on its Not-R input.)

In all cases, this pulse, where present, can only confirm the Reset state of SRU and, hence, of the entire flip-flop.

Should the input S go high, on the other hand, then a "0" appears on the output of the gate NA1, the flip-flop NSRU moves to a Set state, and its output Q (which also forms the output of the whole system) goes high while NQ goes low. The last-mentioned signal is taken back to the Not-R input of the flip-flop NSR1, so that this will move to the Reset state until the input S goes low again.

Upon NSR1 moving to the Reset state, its output Q goes low, and the output of NA1 goes high.

Thus, the pulse to the Not-S input of NSRU is terminated, but the duration of that pulse has surely been sufficient to bring NSRU to a Set state because it is upon this occurrence that the pulse is terminated.

The SR flip-flop 10 responsive to signal edges is presently in the Set state, and when S goes low again before R goes high, the SR flip-flop retains its set state. (In view of the circuit symmetry, the reasoning would be exactly the same as before, but with R substituted for S.)

In the event that R goes high before S goes low again, the output of NA2 goes low (because the Set state has now been marked for the SR flip-flop 10 responsive to signal edges, and the Not-R input of NSR2 is, therefore, high), so that NSRU would be reset, as would NSR2 since Q of flip-flop 10 equals 0 now.

Accordingly, under this condition (both S and R high), NSR1 and NSR2 would be in their Reset state, waiting for one or both inputs to go low.

During such transitions, no pulse can reach the inputs of NSRU because, before NSR1 (and/or NSR2) can update the output, the gate NA1 (and/or gate NA2) locks its output at a high.

Of course, a mentionable circumstance would for this type of flip-flop be that of both inputs high at the same time.

In this case, the state into which the SR flip-flop responsive to signal edges would move is unforeseeable, and it even might enter a "metastable" state. This is no fault of the SR flip-flop 10 responsive to signal edges, but merely the logical outcome of the circuit definition assuming a timed succession of events, and not an overlap.

Thus, as with all logic circuits, a suitable time separation between input events should be maintained, in addition to a minimum time duration for the Set and Reset pulses. (For example, reference is made in the vast collection of literature dealing with flip-flops of the D type to setup, hold, pulse width times, etc.)

While in the diagram of FIG. 1, three SR flip-flops of the NAND type and two NAND gates have been shown, it would also be possible to use SR flip-flops implemented with NOR gates, and by using the outputs NQ (instead of Q) and two NOR gates (instead of the two NAND gates) for the first two, an SR flip-flop can be provided which is responsive to the trailing edges.

More generally, by using flip-flops of both types and/or NOR gates, SR flip-flops 10 responsive to signal edges can be provided with different performance features and characteristics.

In view of the fact that the SR flip-flop 10 is only responsive to edges, its power-on state may be unknown; accordingly, it may be convenient to bring it to a known state by means of a drive signal. That is, it may be convenient to have the level of one or more inputs influence the state of the flip-flop 10. Somewhat inappropriately, such input(s) will be regarded as "asynchronous" for brevity. (Actually, a reference clock ought to be indicated in order for the signal to be truly synchronous or asynchronous.)

On examining FIG. 2, one will readily recognize that it is functionally similar to the version of FIG. 1, with the difference that the output NQ of SRU is directly dependent on its input S, so that NQ will be updated before SRU actually acquires the new state.

Therefore, the pulse to the input S of SRU could last theoretically less than the state acquisition time period. Actually this possibility is rather unlikely to materialize, because of the difference between the direct acquisition path from S to Q of SRU, and the return one from S to NQ of SRU, then from Not-R to Q of NSR1, and lastly from the input to the output of A1.

A similar consideration would apply, of course, to the input R of SRU.

Consider now the gate O1 and the external Clear signal. When Clear is high, the input R of SRU is driven to a high, whereby SRU is brought to and held in a Reset state and the output Q driven to a low. Should useful edges reach the input S of the SR flip-flop 12 responsive to signal edges, the input S of SRU goes high, and high goes its output NQ, but due to this, and as in normal operation, NSR1 is reset, so that said pulse is terminated leaving SRU in a Reset state by virtue of the Clear signal.

In conclusion, everything will operate properly even if the output NQ of SRU is not to be used as an output signal for the SR flip-flop 12 (as shown in FIG. 2) responsive to signal edges.

The advantages of an SR flip-flop 10 and 12 responsive to signal edges according to the invention are the following:
reliable operation resulting from the network topology itself;
unaffected operation by variations in the integration process, temperature, power supply, etc.;
compact design;

excellent dynamic performance capabilities; and independence of the technology (TTL, CMOS, ECL, . . . ) used for implementing the logic gates.

Another point of interest in the manufacture of integrated circuits is that one can revert to an SR flip-flop of standard design by a simple modification to the mask for the interconnection layer (e.g., METAL1).

An SR flip-flop 10 and 12 responsive to signal edges according to this invention is of special advantage in those applications which involve actuations of a logic type or otherwise, such as motor controls.

Understandably, modifications or substitutions may be made unto the embodiments described herein without departing from the spirit and scope of the invention.

For instance, a version of special utility to technologies which allow for COMPLEX-GATE implementation (a non-elementary combinatorial logic using a single "electric logic level") could use an SR flip-flop with NOR gates in lieu of the flip-flop NSRU, and two logic AND gates instead of the two logic NAND gates according to FIG. 1.

We claim:

1. A sequential logic circuit, comprising:

a set terminal;

a reset terminal;

a first flip-flop having a first input terminal coupled to said set terminal, a second input terminal, and an output terminal;

a second flip-flop having a first input terminal coupled to said reset terminal, a second input terminal, and an output terminal;

a first gate having a first input terminal coupled to said set terminal, a second input terminal coupled to said output terminal of said first flip-flop, and an output terminal;

a second gate having a first input terminal coupled to said reset terminal, a second input terminal coupled to said output terminal of said second flip-flop, and an output terminal;

a third flip-flop having a first input terminal coupled to said output terminal of said first gate, a second input terminal coupled to said output terminal of said second gate, a first output terminal coupled to said second input of said first flip-flop, and a second output terminal coupled to said second input of said second flip-flop;

a clear terminal; and a third gate interposed between said second gate and said third flip-flop and having a first input terminal coupled to said output terminal of said second gate, a second input terminal coupled to said clear terminal, and an output terminal coupled to said second input terminal of said third flip-flop.

2. The circuit of claim 1 wherein said third gate comprises a NOR gate.

3. The latch circuit of claim 2 wherein the first gate is an AND gate.

4. The latch circuit of claim 3 wherein the second gate is an AND gate.

5. A latch circuit for producing latch output signals, comprising:

a first flip-flop having a first input terminal, a second input terminal, and an output terminal;

a second flip-flop having a first input terminal, a second input terminal, and an output terminal;

a first gate circuit having a first input coupled to the output terminal of the first flip flop and a second input terminal, the first gate circuit producing an output signal;

a second gate circuit having a first input coupled to the output terminal of the second flip flop and a second input coupled to the input terminal of the second flip flop, the second gate circuit producing an output signal in response to a selected pattern of logic signals at its first and second inputs;

a third gate circuit having a first input coupled to the receive the output signal from the second gate circuit, the third gate circuit further including a control input, the third gate circuit configured to provide an output signal in response to a selected pattern of logic states at its first and control inputs; and a third flip flop having a first input coupled to receive the output signal from the first gate circuit and a second input coupled to receive the output signal from the third gate circuit, the third flip flop producing the latch output signals in response to a selected pattern of logic signals at its first and second inputs.

6. The logic circuit of claim 5 wherein the first input of the first flip flop is coupled to receive a first of the latch output signals.

7. The logic circuit of claim 6 wherein the first input of the second flip flop is coupled to receive a second of the latch output signals.

8. The latch circuit of claim 5 wherein the first gate circuit includes an AND gate.

9. The latch circuit of claim 8 wherein the second gate circuit includes an AND gate.

10. The latch circuit of claim 5 wherein the third gate circuit includes an OR gate.

11. A method of producing output signals in response to signal edges, comprising the steps of:

detecting a first edge of a first signal with a setting circuit by latching the first signal to produce a first latch signal and comparing the first latched signal to the first signal;

in response to the detected first edge setting a flip flop;

detecting a second edge of a second signal with a resetting circuit by latching the second signal to produce a second latch signal and comparing the second latched signal to the second signal;

gating the second latch signal in response to a clearing signal to produce a gated latch signal by:

providing the clear signal to a logic gate;

providing the second latch signal to the logic gate; and producing the gated latch signal with the logic gate in response to the logic states of the clear signal and the second latch signal; and comparing the first latch signal and the gated latch signal with an output circuit including the flip-flop to produce a first output signal.

12. The method of claim 11 further including the step of feeding back the output signal to the setting circuit to reset the setting circuit.

13. The method of claim 12 further including the step of feeding back the output signal to the resetting circuit to reset the resetting circuit.

14. The method of claim 11 wherein the step of comparing the latched signal to the first signal comprises the step of combining the first signal and latch signal in a logical AND.

15. The method of claim 14 wherein the step of comparing the latched signal to the second signal comprises the step of combining the second signal and latch signal in a logical AND.

16. The method of claim 11 wherein the step of gating the second latch signal comprises the step of combining the clearing signal and the second latch signal in a logical OR.

* * * * *